United States Patent
Kemmer

[19]

[11] Patent Number: 6,013,562
[45] Date of Patent: Jan. 11, 2000

[54] PROCESS FOR CONNECTING ELECTRIC CONTACT POINTS USING ANODIC BONDING

[76] Inventor: Josef Kemmer, Am Isarbach 30, D-85764 Oberschleissheim, Germany

[21] Appl. No.: 08/532,614
[22] PCT Filed: Apr. 8, 1994
[86] PCT No.: PCT/DE94/00390
  § 371 Date: Dec. 27, 1995
  § 102(e) Date: Dec. 27, 1995
[87] PCT Pub. No.: WO94/24701
  PCT Pub. Date: Oct. 27, 1994

[30] Foreign Application Priority Data

Apr. 8, 1993 [DE] Germany .............................. 43 11 762

[51] Int. Cl.$^7$ .......................... H01L 21/603; H01L 21/58
[52] U.S. Cl. .......................... 438/455; 438/660; 257/777
[58] Field of Search .................................... 438/660, 455; 257/777, 758

[56] References Cited

U.S. PATENT DOCUMENTS 5,388,460  2/1995  Sakurai et al. ........................ 73/517 R

OTHER PUBLICATIONS

T. Anthony, "Dielectric isolation of silicon by anodic bonding", Journal of Applied Physics 58, pp. 1240–1247, Aug. 1985.

S. Ghandhi, "The theory and practice of microelectronics," John Wiley and Sons, pp. 175–178 (no month available), 1968.

Primary Examiner—Charles Bowers
Assistant Examiner—Keith Christianson
Attorney, Agent, or Firm—Antonelli, Terry, Stout & Kraus, LLP

[57] ABSTRACT

A process for connecting multiple electric contact points of at least one substrate with corresponding contact points of a further substrate is distinguished by the respective electric contacting points of both substrates coming to at least partially lie on top of each other and by the respective substrates being connected to each other by means of anodic bonding.

15 Claims, 4 Drawing Sheets

SD  BPD  BD  BPL  LP

MS  SD  AB  S2  KS

SD1　KS1　SD2　KS2　SD2　KS3

KS1　KSL　KS2　KS3　AE

SD1　KS1　SD2　KS2　SD2　KS3

PROCESS FOR CONNECTING ELECTRIC CONTACT POINTS USING ANODIC BONDING

DESCRIPTION

1. Technical Field

The present invention relates to a process for simultaneously connecting two or more substrates having one or multiple electrical contacts using anodic bonding.

2. State of the Art

Simultaneously producing multiple electric contact points is a task that has to be mastered, particularly, in microelectronics. Several methods are used for this purpose, the best known ones are ultrasonic bonding and bump bonding. Although ultrasonic bonding is a finely perfected process, it has the disadvantage that, due to the thickness of the wire, the contact area has to be approximately 50 $\mu$m×100 $\mu$m. Another disadvantage is that a certain portion of the ultrasonic connections may be defective. In the course of time, the bond wires separate. The bondings are usually carried out automatically However, there are special components, such as, e.g., the so-called strip detectors for detecting ionizing radiation, in which up to several thousand contacts have to be manually bonded. This is an extremely complicated and expensive procedure, in which faulty connections may occur.

3. Description of the Invention

Bump bonding is a technologically sophisticated process, in which the contact points are coated with ball-shaped metals with a low melting point. During the connecting procedure, both components, the electronic chip and the substrate are placed on top of each other and heated. The contact balls alloy with the metal contacts on the substrate. This technology is not compatible with all components and is not available in many fabrications or laboratories.

The described disadvantages of both processes can be avoided by means of the invented process of simultaneously connecting multiple contact points. In this method, the known anodic bonding process used in sensor technology for connecting silicon chips to glass substrates is utilized. In this case, the clean, plane silicon surface is placed together with a clean, plane pyrex glass surface, heated to temperatures of approximately 400° C., an electric field is applied and the two parts are pressed together locally. Under these conditions, close, permanent junction between the pyrex glass and the silicon chip is yielded.

This process has hitherto been employed in bonding techniques in order to, e.g., connect silicon sensor chips to a glass substrate, but not to produce electric contacts. An element of the present invention is that the process may be used to simultaneously connect a large number of electric lines. In this case, the enormous connecting power between pyrex glass and silicon, which presses the contacts together, into each other and onto each other, is utilized. The electric connection can be further improved by means of ultrasonic action or alloying prior to, during or following the bonding process. According to present knowledge, the anodic bonding works especially well between silicon and pyrex glass. For this reason, the two substrates to be connected in the bonding region preferably have to have a pyrex glass area respectively a silicon surface or a silicon oxide surface. In the most simple case, e.g., silicon chips can be directly bonded with metallized pyrex substrates. However, it is sometimes more advantageous to employ substrates of other material, which only have to be coated with pyrex glass respectively silicon only in the bonding region.

The simplest way to produce an electric connection between two substrates is if they each have a thin metal coat in the contact region. This metal coat may, e.g., as customary in fabricating semiconductors, be applied by means of a sputtering process and be photolithographically structured. If the contact areas of the substrates prepared in this manner are brought into contact, the bonding regions usually, as they lie lower, only touch if at least one of the both substrates is malleable. An air gap is created between the contact point and the bonding region, the width of this air gap being dependent on the space between the two substrates, their elasticity and under circumstances the pressing together pressure. The double width of this air gap plus the desired width of the bonding region are simultaneously also the lower limit of the space between the contact points if they are supposed to be bonded.

In FIG. 1, the width of this air gap as the function of the space (sum of the coat thickness of both contacts) is plotted. Employed were a silicon wafer of 380 $\mu$m as the first substrate and a pyrex glass wafer on 800 $\mu$m thickness as the second substrate. It can be seen that with an overall contact thickness of 1.35 $\mu$m, the gap is approximately 500 $\mu$m wide. The contact points therefore have to be more than 1 mm apart if they are to be bonded. This is however not absolutely necessary. In order to obtain a gap width of just a few $\mu$m, the spaces have to be reduced to less than 10 mm. This can be obtained also without reducing the contact metal thickness by embedding the contact region in at least one of the substrates.

As the electric contacts are created by pressing the two substrates against each other in the contact region, it is advantageous if these are readily malleable This is, e.g., the case of metals such as aluminum and gold. Particularly advantageous if special contact structures which interlock like teeth are employed. This will be illustrated later in a preferred embodiment.

For many applications, it is sufficient to design the metal contacts on one of the two substrates as springs or pins which produce a contact like in known plug-in connections.

If very many electric contacts are to be connected, the respective strip conductors are embedded in the substrate in several planes lying on top of each other. The known methods for producing multi-layer substrates may be employed.

Especially interesting is the invented process for contacting a silicon component having several contacts, because in producing the electric contacts, the component is simultaneously permanently connected to the second substrate. If the second substrate is simultaneously designed as a chip carrier having the unusual plug-in contacts, mounting the chips on the carrier is obviated.

For a number of applications in fundamental research, it is necessary that several large-surface semiconductors, so-called strip detectors, are connected as close as possible electrically and mechanically using as little as possible material. This can be easily achieved because the second substrate can serve both for contacting the strip detectors to each other and as a mechanical connecting element.

The process is also suited for sandwich-like packing together of several layers of semiconductor elements, in particular radiation detectors or memory chips.

A metallized second substrate can also produce a contact to doped regions of a first substrate, preferably a silicon component. Finally, the invented process even offers the possibility of realizing MIS, preferably MOS structures, which can be employed as essential part of the component, in particular of radiation detectors.

BRIEF DESCRIPTION OF THE DRAWINGS

The invented process is made more apparent using preferred embodiments which are depicted in the following drawings, in which.

DETAILED DESCRIPTION OF THE PREFERRED EMBODIMENTS

Figure 1:
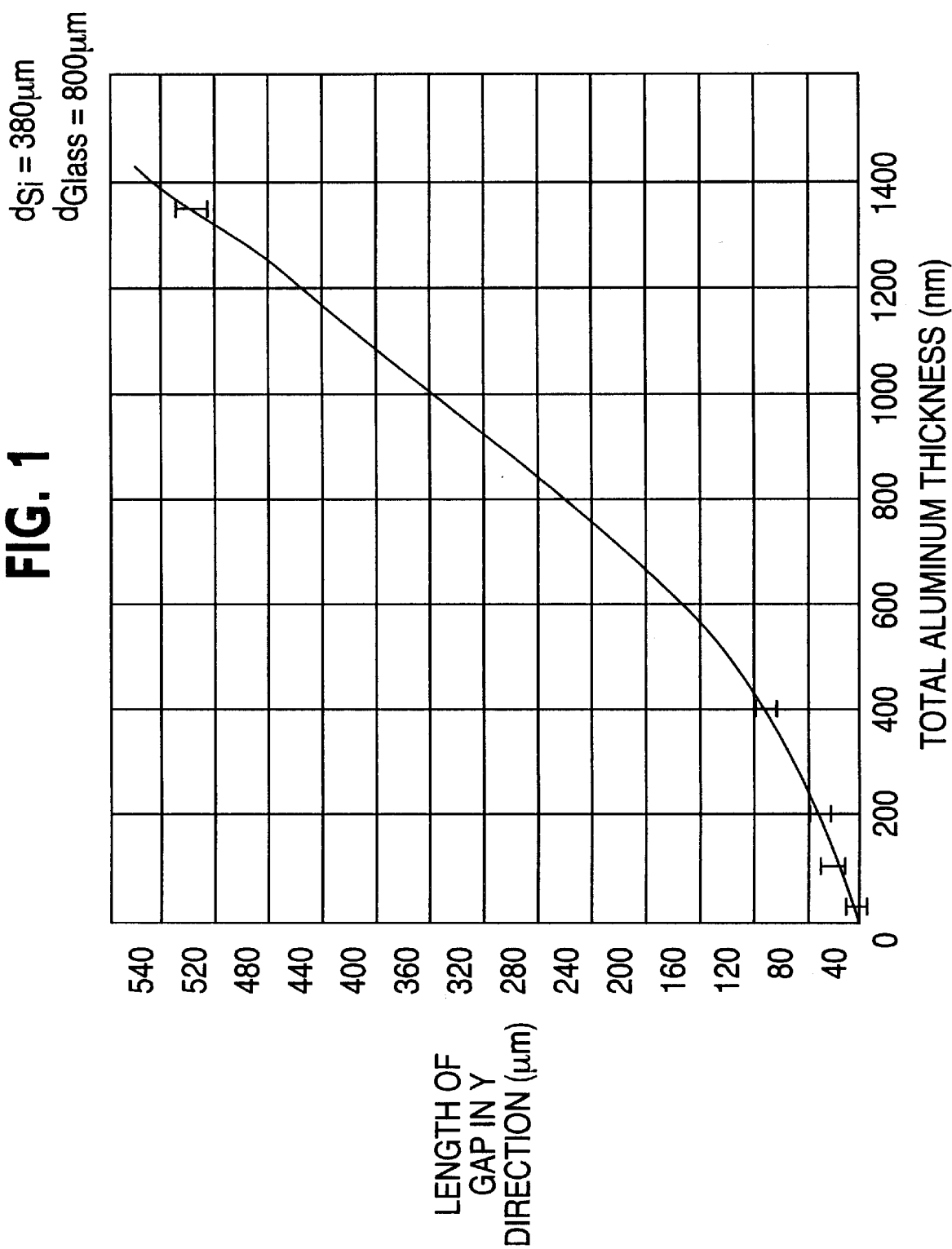
FIG. 1 shows the width of the air gap between the strip conductors and the bond regions in dependence on the space between the two substrates. Pyrex glass of 800 µm thickness and a silicon wafer of 380 µm thickness were employed.

FIG. 1 has already been explained. The relationship between the space between the substrates and the width of the air gap between the strip conductor and the bonding point is plotted on the graph. The minimum spacing of the strip conductors for this system can be read from it.

Figure 2:
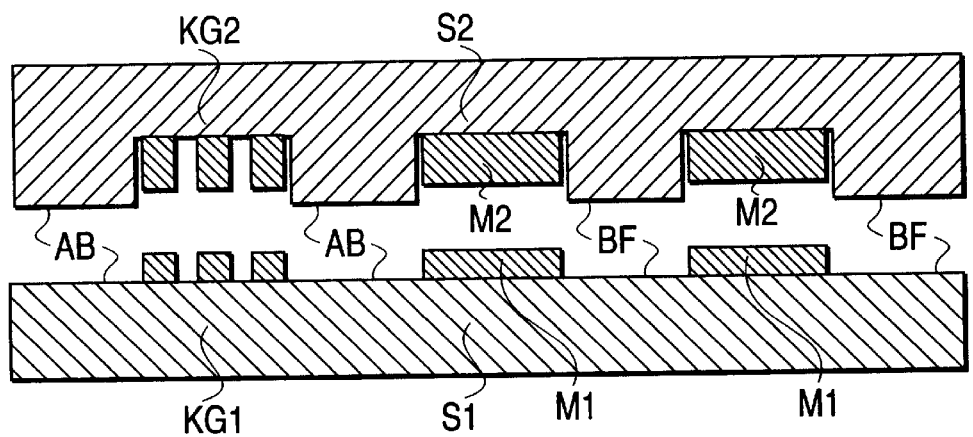
FIG. 2 shows a cross section through the contact region of two substrates (S1, S2), with the strip conductors (KG2, M2) of the second substrate (S2) embedded therein.

As the strip conductors in microelectronics usually have a thickness of approximately 1 µm to 1.5 µm due to reasons of conductivity, it is useful to embed the strips in at least one of the substrates (S1) or (S2) in order to reduce the spacing of the bonding region if possible to below 40 nm. An arrangement of this type is shown in the preferred embodiment in FIG. 2. On the left side is a group (KG1, KG2) of close together contacts which are anodically bonded only in the peripheral region (AB). In the right group, on the other hand, the metal contacts (M1, M2) are separated by a bonding area (BF). This example should show that the design of the contact region can be largely adapted to the special design of a component. This is an advantage that none of the known contacting processes can offer.

Figure 3:
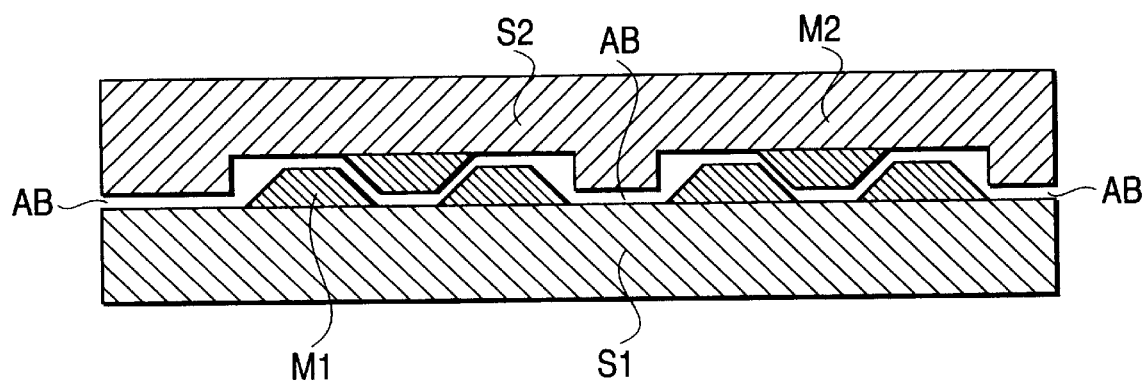
FIG. 3 shows, trapezoid structured contacts (M1, M2) which interlock upon contacting.

In FIG. 3, the metal contacts of the two substrates,(S1) and (S2) are designed trapezoid and interlock when carrying out the bonding procedure in the regions (AB) in such a manner that with exact alignment a very close connection of the metal layers (M1) and (M2) can be obtained.

Figure 4:
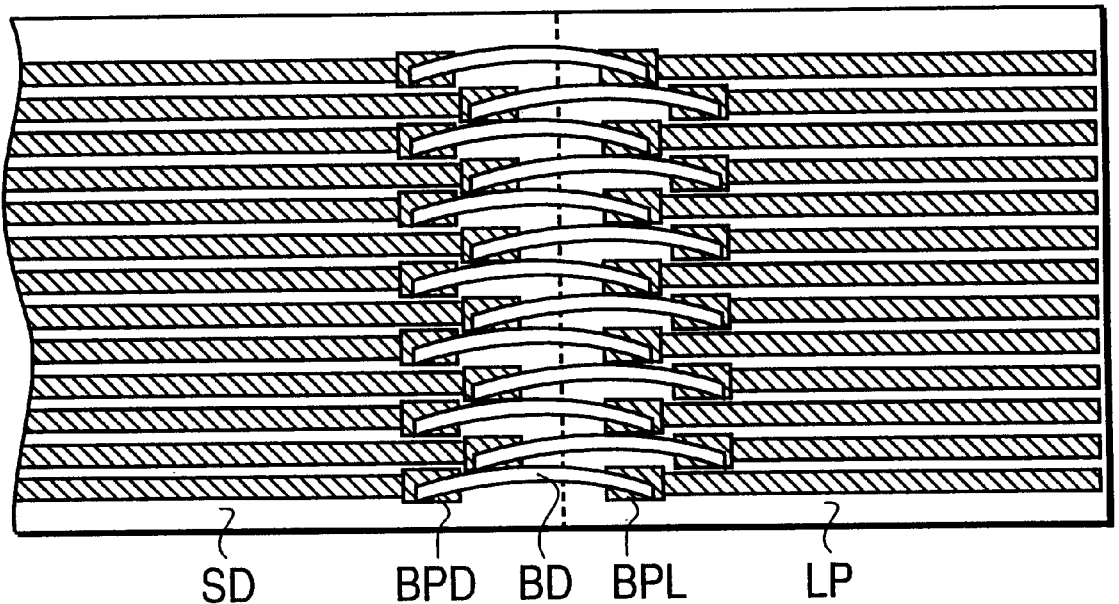
FIG. 4 shows a stop view of a schematic representation of the contact region of a conventional strip detector for determining the location of traversing particles.
Figure 5:
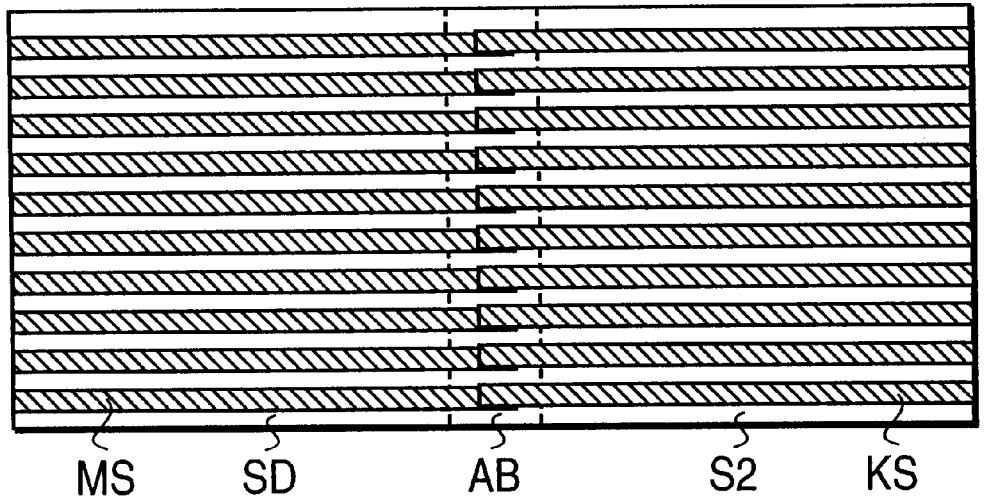
FIG. 5 shows a schematic top view of the contacting region of a strip detector which is contacted with the aid of the invented connection.

As the invented contacting process is especially advantageous in the case of components having extremely high contact density, FIGS. 4 and 5 show schematically the contact region of a strip conductor (SD). In FIG. 4, the bonding pads (BPD) of the detector are connected to the bonding pads (BPL) of the conductor board (LP) by means of wires (BD) attached by means of conventional ultrasonic bonding. In FIG. 5, the metal strips (MS) of the strip detectors (SD) are directly pressed onto the contact strips (KS) of the substrate (S2). Pressing and anodically bonding occurs in the peripheral region (AB). These detectors may have several thousand contact points so that in the case of classical ultrasonic connecting the bonding pads have to be arranged in multiple rows and consequently valuable sensor area is lost. In the invented contacting, no additional contact pads are required at all, because contacting is directly onto the strip diodes. Therefore, not only is the layout of the detectors simplified but also the control of the electric parameters in the contact region (AB). Furthermore, the problem of the bonding wires (BD) bending and the danger of their short circuiting is completely eliminated.

Figure 6:
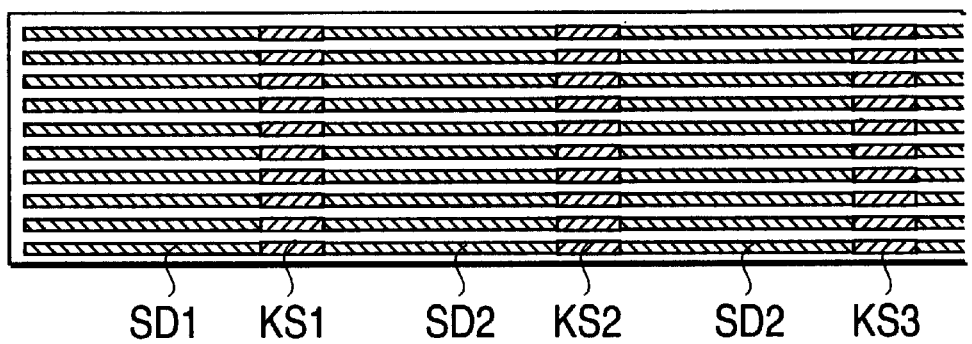
FIG. 6 shows the top view of several strip detectors which are connected to each other with the aid of contact substrates electrically and mechanically.
Figure 7A:
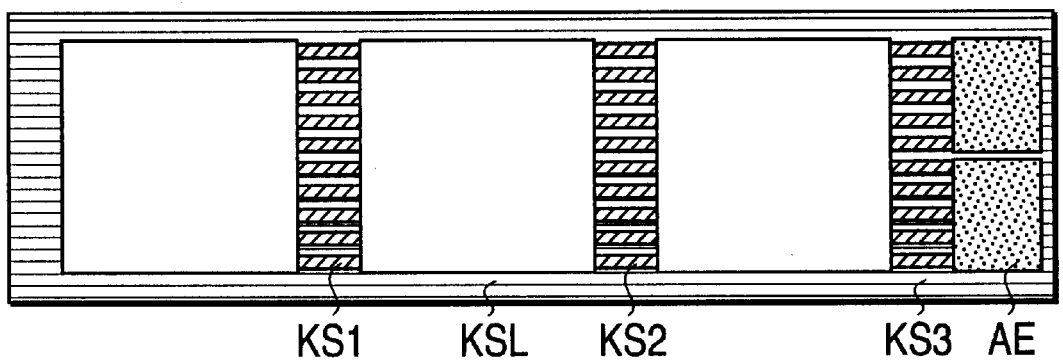
FIG. 7a shows a schematic representation of a second substrate (KSL) of pyrex glass which is designed ladder-shaped and serves to hold the strip detectors and the readout electronics (AE).
Figure 7B:
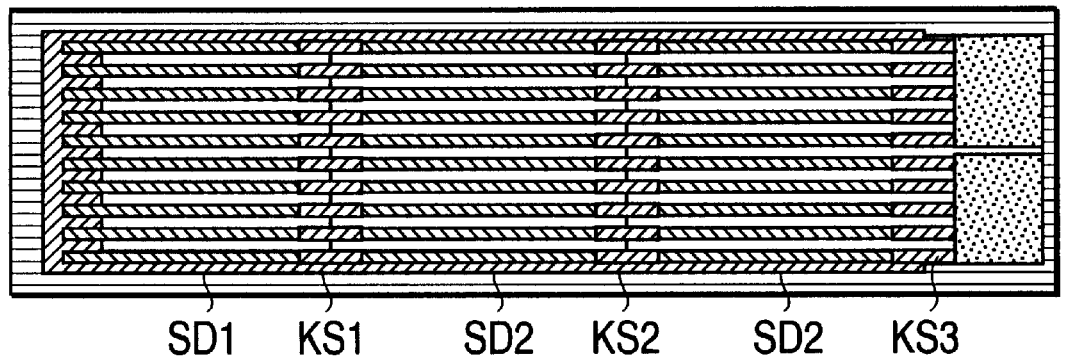
FIG. 7b shows a top view of several strip detectors (SD1, SD2, SD3) which are electrically connected to each other and mechanically attached with the aid of a ladder-shaped contacting substrate (KSL).

The special advantages of simultaneously contacting are apparent when assembling arrays of strip detectors like those required in experiments in high-energy physics. This is schematically shown in FIG. 6 in which multiple strip detectors (SD1, SD2, SD3) are connected to each other unsupported with the aid of metallized contact substrates (KS1, KS2). Connection to readout electronics is established by means of a metallized substrate (KS3). A more stable configuration is shown in FIGS. 7a and 7b in which the contact substrate is simultaneously utilized in addition to the electric connection also as a mechanical support. For stability, it is executed as a ladder-shaped frame (KSL) onto which the detectors (SD1, SD2, SD3) are anodically bonded. The intermediate spaces are required in order to let a beam of particles pass. The bonding connection can occur on the peripheral region of the rectangular detectors. The electric contacting occurs in the contact regions (KS1, KS2, KS3). On the substrate, (KSL) parts of the readout electronics (AE) can also be integrated.

The described process can also be utilized for producing a strip detector described in P 41 14 821.5 respectively P 41 20 443.3. This detector employs accumulation and inversions layers which are generated with the aid of MOS structures. Such MOS structures can be formed by means of bonding on metallized substrates onto both sides of an oxidized silicon wafer.

If the thickness of the substrate, e.g., only amounts to 100 µm, they present no major obstacle to some radiation but simultaneously serve as a protection zone for the silicon lying under it.

The examples described here were selected to illustrate the possible uses of the invented simultaneous contacting. They however do not cover all possible applications. In particular, other anodic bondable substrates, e.g., silicon/silicon can be also employed instead of the substrate combination silicon/pyrex glass. The former has the advantage that due to being the same material no tensions occur and grooves can be produced for the strip conductors by means of anistropic etching. This goal can however also be achieved by replacing the pyrex glass, e.g., with pyrex glass coated silicon.

What is claimed is:

1. A process for connecting multiple electric contact points of a first substrate with corresponding multiple electric contact points of a second substrate, comprising:

providing a first substrate having a plurality of spaced electric contact points;

providing a second substrate having a plurality of spaced electric contact points adjacent said first substrate such that said spaced electric contact points of said second substrate at least partially overlie said spaced electric contact points of said first substrate;

anodically bonding said first and second substrates together in bonding regions adjacent at least some of said spaced electric contact points, whereby the resulting bond between said first and second substrates in said bonding regions presses respective spaced electric contact points of said first and second substrates together to electrically connect said respective spaced electric contact points.

2. A process according to claim 1, wherein said first substrate is a metallized glass substrate, and said second substrate is a silicon chip.

3. A process according to claim 1, characterized by prior to, during or following the step of anodically bonding said first and second substrates together, an ultrasonic bonding being executed.

4. A process according to claim 1, characterized by prior to, during or following the step of anodically bonding said first and second substrates together, an alloying is performed.

5. A process according to claim 1, characterized by at least one of said first and second substrates being provided with a glass area in the bonding regions.

6. A process according to claim 1, characterized by at least one of said first and second substrates being provided with a silicon surface or a silicon oxide surface in the bonding regions.

7. A process according to claim 1, characterized by the contact points being metal, electric contacts placed in the form of thin layers on at least one of said first and second substrates.

8. A process according to claim 1, characterized by said electric contact points on at least one of the said first and second substrates being embedded to such a depth in the substrate body that during the bonding procedure the bonding regions of both said first and second substrates can touch each other.

9. A process according to claim 7, characterized by said metal contacts being readily malleable on at least one of said first and second substrates.

10. A process according to one of the claim 7, characterized by said metal contacts being elastic or plug-in connections on at least one of said first and second two substrates.

11. A process according to claim 1, characterized by at least one of said first and second substrates containing conductor strips in multiple layers.

12. A process according to claim 1 characterized by parts of one of said first and second substrates being silicon components and by another of said first and second substrates simultaneously serving as a mechanical connecting element between at least two of said silicon components.

13. A process according to claim 12, characterized by on both sides of said one substrate being silicon components or being mounted.

14. A process according to claim 13, characterized by said electric contact points of at least one of said first and second substrates not being metallized but rather being made conductive by means of doping.

15. A process according to claim 1, characterized by said resulting bond taking place between said first and second substrates only in areas outside said electric contact points.

* * * * *